(12) United States Patent
Cascio et al.

(10) Patent No.: US 11,329,636 B2
(45) Date of Patent: *May 10, 2022

(54) LEVEL SHIFTER SYSTEM AND CAPACITIVE-COUPLED LEVEL SHIFTER

(71) Applicant: Infineon Technologies Austria AG, Villach (AT)

(72) Inventors: Giacomo Cascio, Villach (AT); Salvatore Angelo Della Fortuna, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/990,325

(22) Filed: Aug. 11, 2020

(65) Prior Publication Data
US 2020/0373914 A1 Nov. 26, 2020

Related U.S. Application Data

(63) Continuation of application No. 16/410,171, filed on May 13, 2019, now Pat. No. 10,749,509.

(51) Int. Cl.
| H03K 3/0233 | (2006.01) |
| H03K 17/687 | (2006.01) |
| H03H 7/00 | (2006.01) |
| H03K 19/0185 | (2006.01) |

(52) U.S. Cl.
CPC ......... *H03K 3/02337* (2013.01); *H03H 7/004* (2013.01); *H03K 17/6871* (2013.01); *H03K 19/018514* (2013.01); H03K 2217/0063 (2013.01)

(58) Field of Classification Search
None
See application file for complete search history.

(56) References Cited

U.S. PATENT DOCUMENTS

| 10,116,297 | B1 | 10/2018 | Wu |
| 10,749,509 | B1* | 8/2020 | Cascio ............... H03K 3/02337 |
| 2004/0155692 | A1 | 8/2004 | Ochi |
| 2008/0238513 | A1 | 10/2008 | Poenaru et al. |
| 2010/0123478 | A1 | 5/2010 | Osaka |
| 2011/0304389 | A1 | 12/2011 | Vogler et al. |
| 2016/0367813 | A1 | 12/2016 | Pepin et al. |

FOREIGN PATENT DOCUMENTS

EP 0764360 A1 3/1997

OTHER PUBLICATIONS

"LMG1210 200-V, 1.5-A, 3-A Half-Bridge MOSFET and GaN FET Driver with Adjustable Dead Time for Applications up to 50 MHz", Texas Instruments, LMG1210, SNOSD12C, Dec. 2018, Revised Nov. 2018.

* cited by examiner

*Primary Examiner* — Cassandra F Cox
(74) *Attorney, Agent, or Firm* — Murphy, Bilak & Homiller, PLLC

(57) ABSTRACT

A capacitive-coupled level shifter includes a capacitive divider circuit having a first capacitive divider branch configured to couple a first input terminal to a first comparator terminal and a second capacitive divider branch configured to couple a second input terminal to a second comparator terminal. The first capacitive divider branch and the second capacitive divider branch are symmetric so as to cancel out a common mode voltage of a modulated signal input to the capacitive divider circuit. A level shifter system which includes the capacitive-coupled level shifter is also described.

14 Claims, 13 Drawing Sheets

LEVEL SHIFTER SYSTEM AND CAPACITIVE-COUPLED LEVEL SHIFTER

BACKGROUND

Level shifters are used in applications where there is a need to interface between different voltage domains. Level shifters can be full-swing or floating, which can be distinguished by whether the voltage domains share a common ground potential. Floating level shifters are used to shift the potential of control signals from circuits powered by low voltage power rails to the potential of circuits with floating power and ground rails. Floating level shifters are often used in gate drivers to drive power output stages in applications such as DC-DC converters, biomedical transducer drivers, Class-D audio amplifiers, MEMS, LCD drivers, high voltage charge pumps, switched-capacitor supplies, etc.

While the gate driver typically is exposed to relatively low voltages, the level shifter and possibly other components such as a bootstrap switch or diode must use high-voltage components, i.e., components which can withstand the whole input voltage range. If the high voltage range is higher than the maximum allowed voltage for the single component but still within the technology capability, cascoding approaches can also be used.

There are several ways to implement a high voltage level shifter such as cascading a high voltage device, transformer based level shifting and capacitance based level shifting. The cascoding approach tends to be slower due to the stacking of devices which typically are high voltage and therefore consume layout area, degrade (speed) performance and require accurate parasitic modelling and extraction. For high speed gate driver applications such as full-bridge, half-bridge, non-isolated buck topologies, etc. where high common mode rejection is crucial to ensure a reliable output signal, the main advantage of transformer and capacitive based level shifting solutions is that they are dynamically driven. Since inductors and capacitors block any DC component of the signal, the control signal is transformed into a sequence of pulses, either single-ended or differential, which drive the transformer or capacitor. A static control input signal is therefore translated into a continuous sequence of pulses which refresh the stage of the gate driver in order to prevent false triggering due to noise. The repetition rate is defined by application conditions like switching frequency and duty cycle and may translate in sub-nanosecond requirements. This in turn implies high current consumption.

Thus, there is a need for an improved level shifter design.

SUMMARY

According to an embodiment of a capacitive-coupled level shifter, the capacitive-coupled level shifter comprises: an input having a positive input terminal and a negative input terminal, the input configured to receive a modulated signal in a first voltage domain; a comparator circuit configured to shift the modulated signal to a second voltage domain higher than the first voltage domain; and a capacitive divider circuit comprising a first capacitive divider branch coupling the positive input terminal of the input to a positive input terminal of the comparator circuit and a second capacitive divider branch coupling the negative input terminal of the input to a negative input terminal of the comparator circuit, the first capacitive divider branch and the second capacitive divider branch being symmetric so as to cancel out a common mode voltage of the modulated signal.

In one embodiment, the first capacitive divider branch comprises a first capacitor coupling the positive input terminal of the input to the positive input terminal of the comparator circuit, a second capacitor coupling a voltage supply for the comparator circuit to the positive input terminal of the comparator circuit, and a third capacitor coupling a switched voltage node to the positive input terminal of the comparator circuit, and the second capacitive divider branch comprises a fourth capacitor coupling the negative input terminal of the input to the negative input terminal of the comparator circuit, a fifth capacitor coupling the voltage supply for the comparator circuit to the negative input terminal of the comparator circuit, and a sixth capacitor coupling the switched voltage node to the negative input terminal of the comparator circuit.

Separately or in combination, the capacitive-coupled level shifter may further comprise a resistor ladder connected between the voltage supply for the comparator circuit and the switched voltage node. The resistor ladder may comprise a first resistor, a second resistor and a third resistor connected in series, the first resistor may be electrically connected between the voltage supply for the comparator circuit and a first terminal of the second resistor, the third resistor electrically may be electrically connected between the switched voltage node and a second terminal of the second resistor, the first terminal of the second resistor may be electrically connected to the negative input terminal of the comparator circuit, and the second terminal of the second resistor may be electrically connected to the positive input terminal of the comparator circuit. The first resistor and the third resistor may be approximately equal, and the second resistor may be less than the first resistor and the third resistor.

Separately or in combination, the input may also have a reference terminal, the capacitive divider circuit may comprise a third capacitive divider branch coupling the reference terminal of the input to a common mode reference terminal of the comparator circuit, and the modulated signal may be single-ended between the positive input terminal of the input and the reference terminal of the input, and between the negative input terminal of the input and the reference terminal of the input.

Separately or in combination, the capacitive-coupled level shifter may further comprise: a first resistor ladder connected between the voltage supply for the comparator circuit and the switched voltage node; a second resistor ladder connected between the voltage supply for the comparator circuit and the switched voltage node; and a third resistor ladder connected between the voltage supply for the comparator circuit and the switched voltage node.

The first resistor ladder may comprise a first resistor, a second resistor and a third resistor connected in series. The first resistor may be electrically connected between the voltage supply for the comparator circuit and a first terminal of the second resistor. The third resistor may be electrically connected between the switched voltage node and a second terminal of the second resistor. The second terminal of the second resistor may be electrically connected to the common mode reference terminal of the comparator circuit.

The second resistor ladder may comprise a fourth resistor and a fifth resistor connected in series. The fourth resistor may be electrically connected between the voltage supply for the comparator circuit and a first terminal of the fifth resistor. A second terminal of the fifth resistor may be electrically connected to the switched voltage node. The first terminal of the fifth resistor may be electrically connected to the negative input terminal of the comparator circuit.

The third resistor ladder may comprise a sixth resistor and a seventh resistor connected in series. The sixth resistor may be electrically connected between the voltage supply for the comparator circuit and a first terminal of the seventh resistor. A second terminal of the seventh resistor may be electrically connected to the switched voltage node. The first terminal of the seventh resistor may be electrically connected to the positive input terminal of the comparator circuit.

Separately or in combination, the capacitive-coupled level shifter of claim 1 may further comprise a resistor ladder configured to fix a DC biasing point of the positive and the negative inputs of the comparator circuit.

Separately or in combination, the comparator circuit may comprise: a differential pair of transistors configured to output an amplified version of the modulated signal in the second voltage domain; and a converter circuit configured to convert the amplified version of the modulated signal into a rail-to-rail digital output signal which is a replica, in the second voltage domain, of a digital control signal from which the modulated signal is generated in the first voltage domain.

Separately or in combination, the capacitive-coupled level shifter may further comprise a speed booster circuit configured to increase gain of the converter circuit. The speed booster circuit may comprise: a PMOS current source electrically connected in series with an NMOS switch between the voltage supply for the comparator circuit and the switched voltage node; and a PMOS switch configured to enable or disable a PMOS current source of the converter circuit based on a state of the rail-to-rail digital output signal provided by the converter circuit.

Separately or in combination, a voltage hysteresis of the capacitive-coupled level shifter may be greater than a 6a sigma equivalent input offset of the comparator circuit and less than the modulated signal input to the comparator circuit with a common mode voltage of the modulated signal cancelled out.

Separately or in combination, no reference terminal may be provided between the positive input terminal and the negative input terminal of the input, no common mode reference terminal may be provided between the positive input terminal and the negative input terminal of the comparator circuit, and the modulated signal may be differential between the positive input terminal of the input and the negative input terminal of the input.

Separately or in combination, the capacitive-coupled level shifter may further comprise a speed booster circuit configured to increase gain of the converter circuit, the comparator circuit may comprise a differential pair of transistors configured to output an amplified version of the modulated signal in the second voltage domain and a first PMOS current source electrically connected to a first NMOS switch driven by a positive output of the differential pair of transistors and electrically connected to a second NMOS switch driven by a negative output of the differential pair of transistors, and the speed booster circuit may comprise a second PMOS current source electrically connected in series with a third NMOS switch driven by the positive output of the differential pair of transistors, and a PMOS switch configured to enable or disable the first PMOS current source based on a state of a rail-to-rail digital output signal provided by the converter circuit.

Separately or in combination, a reference terminal may be provided between the positive input terminal and the negative input terminal of the input, a common mode reference terminal may be provided between the positive input terminal and the negative input terminal of the comparator circuit, and the modulated signal may be single-ended between the positive input terminal of the input and the reference terminal of the input, and between the negative input terminal of the input and the reference terminal of the input.

Separately or in combination, the capacitive-coupled level shifter may further comprise a first speed booster circuit and a second speed booster circuit configured to increase gain of the converter circuit, the comparator circuit may comprise a first differential pair of transistors configured to output a first amplified version of the modulated signal applied between the positive input terminal and the common mode reference terminal of the comparator circuit in the second voltage domain, a second differential pair of transistors configured to output a second amplified version of the modulated signal applied between the negative input terminal and the common mode reference terminal of the comparator circuit in the second voltage domain, a first PMOS current source electrically connected to a first NMOS switch driven by a positive output of the first differential pair of transistors and electrically connected to a second NMOS switch driven by a common reference output of the first and the second differential pairs of transistors, and a second PMOS current source electrically connected to a third NMOS switch driven by a negative output of the second differential pair of transistors and electrically connected to a fourth NMOS switch driven by the common reference output, the first speed booster circuit may comprise a third PMOS current source electrically connected in series with a fifth NMOS switch driven by the common reference output, and a first PMOS switch configured to enable or disable the first PMOS current source based on a state of a rail-to-rail positive digital output signal provided by the converter circuit, and the second speed booster circuit may comprise a fourth PMOS current source electrically connected in series with a sixth NMOS switch driven by the common reference output, and a second PMOS switch configured to enable or disable the second PMOS current source based on a state of a rail-to-rail negative digital output signal provided by the converter circuit.

According to an embodiment of a level shifter system, the level shifter system comprises at least one capacitive-coupled level shifter comprising: an input having a positive input terminal and a negative input terminal, the input configured to receive a modulated signal in a first voltage domain; a comparator circuit configured to shift the modulated signal to a second voltage domain higher than the first voltage domain; and a capacitive divider circuit comprising a first capacitive divider branch coupling the positive input terminal of the input to a positive input terminal of the comparator circuit and a second capacitive divider branch coupling the negative input terminal of the input to a negative input terminal of the comparator circuit, the first capacitive divider branch and the second capacitive divider branch being symmetric so as to cancel out a common mode voltage of the modulated signal. The level shifter system further comprises: a modulator configured to modulate a carrier with a digital control signal to form a continuous sequence of pulses, and input the continuous sequence of pulses as the modulated signal to the input of the at least one capacitive-coupled level shifter; and an SR latch having a set input electrically connected to a first output of the at least one capacitive-coupled level shifter and a reset input electrically connected to a second output of the at least one capacitive-coupled level shifter, the SR latch configured to output a level-shifted signal based on a state of the set input and the reset input.

Separately or in combination, the level shifter system may comprise a first capacitive-coupled level shifter and a second capacitive-coupled level shifter. For each capacitive-coupled level shifter, no reference terminal may be provided between the positive input terminal and the negative input terminal of the input, no common mode reference terminal may be provided between the positive input terminal and the negative input terminal of the comparator circuit, and the modulated signal may be differential between the positive input terminal of the input and the negative input terminal of the input. The modulator may be configured to apply the differential modulated signal to the first capacitive-coupled level shifter when the digital control signal is in a first state and apply the differential modulated signal to the second capacitive-coupled level shifter when the digital control signal is in a second state. The first capacitive-coupled level shifter may be configured to apply the shifted modulated signal to the set input of the SR latch when the digital control signal is in the first state. The second capacitive-coupled level shifter may be configured to apply the shifted modulated signal to the reset input of the SR latch when the digital control signal is in the second state.

Separately or in combination, the level shifter system may comprise a single capacitive-coupled level shifter. The single capacitive-coupled level shifter may comprise a reference terminal between the positive input terminal and the negative input terminal of the input, and a common mode reference terminal between the positive input terminal and the negative input terminal of the comparator circuit. The modulated signal may be single-ended between the positive terminal and the reference terminal of the input, and between the negative input terminal and the reference terminal of the input. The modulator may be configured to apply the single-ended modulated signal between the positive input terminal and the negative input terminal of the input of the single capacitive-coupled level shifter when the digital control signal is in a first state, and to apply the single-ended modulated signal between the negative input terminal and the negative input terminal of the input of the single capacitive-coupled level shifter when the digital control signal is in a second state. The single capacitive-coupled level shifter may be configured to apply the shifted modulated signal to the set input of the SR latch when the digital control signal is in the first state and to the reset input of the SR latch when the digital control signal is in the second state.

Separately or in combination, the level shifter system may be configured to apply the level-shifted signal to a high-side gate driver.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a capacitive-coupled level shifter. The capacitive-coupled level shifter may be used in many types of applications, including applications which require operation at high voltages, even beyond the breakdown capability of the devices available in the technology of choice. For example, the capacitive-coupled level shifter may be used for high-side gate drivers where the control signal is translated from a low voltage (e.g. digital) domain to a supply domain of the gate driver. The supply domain of the gate driver may be static or dynamic.

The capacitive-coupled level shifter may be used in high speed and high power applications such as full-bridge, half-bridge or non-isolated buck topologies, where high common mode rejection is necessary to ensure a reliable output signal. An enhanced power supply rejection ratio may also be necessary to cope with high supply noise induced by overshoot and undershoot in operation.

The capacitive-coupled level shifter may be used in applications having as key parameters minimization of propagation delay, its mismatch and spread over temperature and process. For example, the capacitive-coupled level shifter may be used as a floating level shifter for a gate driver to drive power output stages in applications such as DC-DC converters, biomedical transducer drivers, Class-D audio amplifiers, MEMS, LCD drivers, high voltage charge pumps, switched-capacitor supplies, etc.

For high speed gate driver applications such as full-bridge, half-bridge, non-isolated buck topologies, etc. where high common mode rejection is needed to ensure a reliable output signal, the capacitive-coupled level shifter has the advantage of being dynamically driven. Since capacitors included in the capacitive-coupled level shifter block any DC component of the control signal, the control signal may be modulated into a sequence of pulses, either single-ended or differential, which drive the capacitive-coupled level shifter. A static control input signal may therefore be translated into a continuous sequence of pulses which refresh the level shifter to prevent false triggering due to noise. The repetition rate may be defined by application conditions such as switching frequency and duty cycle, and may translate to sub-nanosecond requirements.

The capacitive-coupled level shifter offers higher speed performance, has less dependency over temperature and process variation, and occupies less chip (die) area compared to other levels shifter solutions. The maximum allowable voltage swing of the capacitive-coupled level shifter is determined by the maximum voltage applicable across the capacitors, i.e., the maximum oxide voltage breakdown of the coupling capacitors. The modulation and de-modulation scheme can be either digital or analog depending on the desired complexity and product constraints. Described next are various embodiments of the capacitive-coupled level shifter and related systems.

Figure 1:
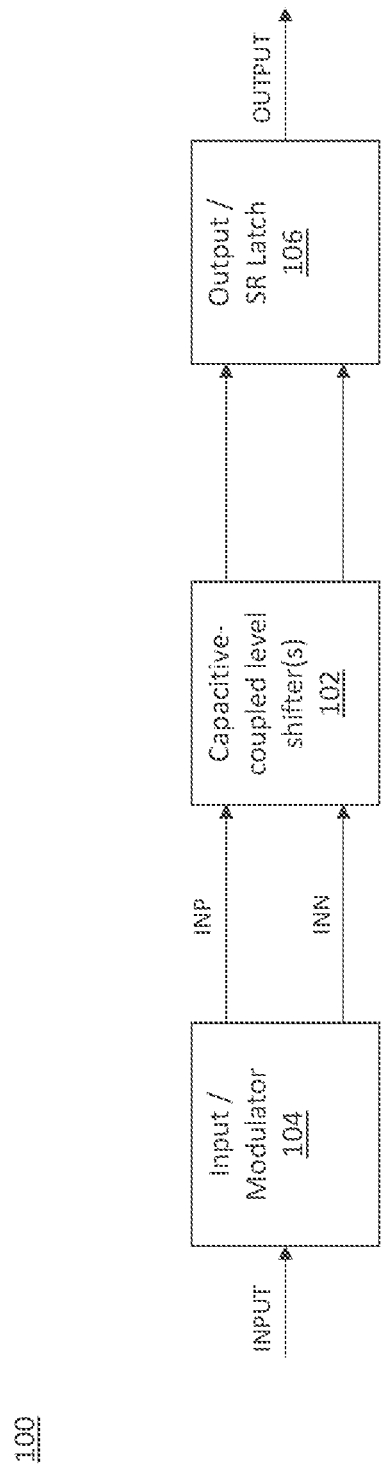
FIG. 1 illustrates a block diagram of an embodiment of a level shifter system that includes at least one capacitive-coupled level shifter between an input/modulator and an output/SR latch.

FIG. 1 illustrates an embodiment of a level shifter system 100 that includes at least one capacitive-coupled level shifter 102 between an input/modulator 104 and an output/SR latch 106. The input/modulator 104 is typically driven from a low voltage domain, e.g., a digital domain and has two inverted digital output signals INP, INN which form a modulated signal for driving each capacitive-coupled level shifter 102 in the low-side voltage domain. The capacitive-coupled level shifter(s) 102 propagate the low-side modulated signal toward the output/SR latch 106. The capacitive-coupled level shifter(s) 102 hold and withstand the voltage difference between the supply domain for the input/modulator 104 and the supply domain for the output/SR latch 106.

The output/SR latch 106 is typically in a high-side voltage domain, and provides the output signal (OUTPUT) which is a replica of the input signal (INPUT) shifted in the high-side voltage domain. The output signal can be used as a control signal for a gate driver, charge pump or in general for any type of actuator. For example, a gate driver which receives the output signal from the levels shifter system 100 may be a high-side gate driver for driving high-side power output stages in applications such as DC-DC converters, biomedical transducer drivers, Class-D audio amplifiers, MEMS, LCD drivers, high voltage charge pumps, switched-capacitor supplies, etc. In general, the level shifter system 100 may be used in any type of application requiring an interface between different voltage domains such as, but not limited to, high speed and high power applications like full-bridge, half-bridge or non-isolated buck topologies, etc.

With the level shifter system 100 shown in FIG. 1, voltage stress is concentrated across coupling capacitors of each capacitive-coupled level shifter 102. Depending on the high-side voltage requirements, different capacitor types (e.g. metal vertical or horizontal, poly-to-poly, etc.) may be used. The input/modulator 104 and the output/SR latch 106 of the level shifter system 100 are designed to withstand dynamic current (AC) flowing through the capacitors of each capacitive-coupled level shifter 102 during switching events (e.g. in bootstrap applications) to ensure signal integrity for a reliable state.

Figure 2:
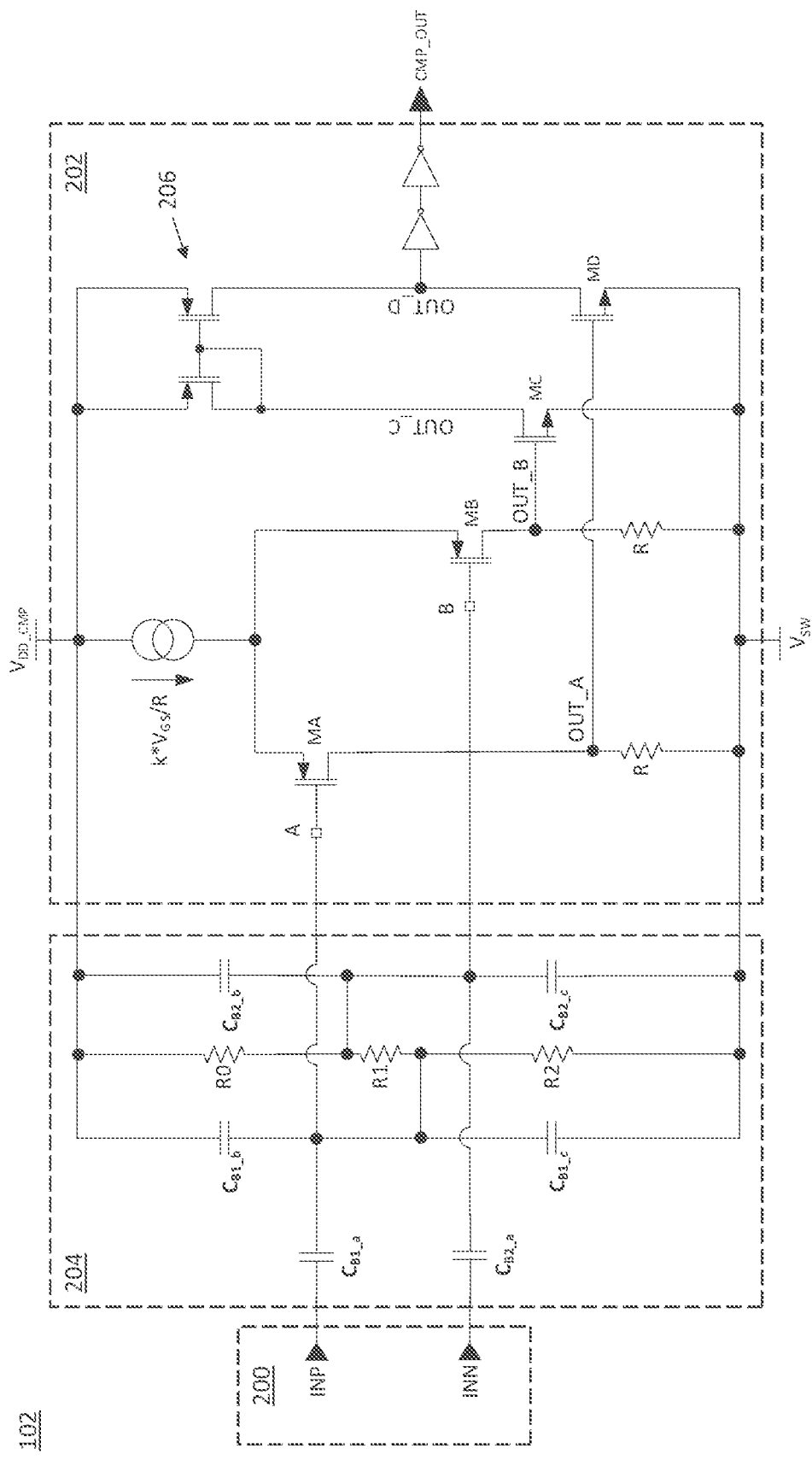
FIG. 2 illustrates a circuit schematic of an embodiment of a capacitive-coupled level shifter.

FIG. 2 illustrates an embodiment of the capacitive-coupled level shifter 102 included in the level shifter system 100 shown in FIG. 1. According to this embodiment, the capacitive-coupled level shifter 102 has an input 200 having a positive input terminal INP and a negative input terminal INN. The input 200 of the capacitive-coupled level shifter 102 receives a modulated signal in a first voltage domain from the input/modulator 104 of the level shifter system 100. The capacitive-coupled level shifter 102 also has a comparator circuit 202 that shifts the modulated signal at the input terminals INP, INN to a second voltage domain higher than the first voltage domain. A capacitive divider circuit 204 capacitively couples the input terminals INP, INN to the comparator circuit 202, and ensures a high pass behavior of the modulated signal at the input terminals INP, INN.

The capacitive divider circuit 204 includes a first capacitive divider branch coupling the positive input terminal INP to a positive input terminal (A) of the comparator circuit 202, and a second capacitive divider branch coupling the negative input terminal INN to a negative input terminal (B) of the comparator circuit 202. The first capacitive divider branch and the second capacitive divider branch are being symmetric so as to cancel out a common mode voltage of the modulated signal at the input terminals INP, INN of the capacitive-coupled level shifter 102.

In one embodiment, the first capacitive divider branch of the capacitive divider circuit 204 includes a first capacitor $C_{B1\_a}$ coupling the positive input terminal INP to the positive input terminal A of the comparator circuit 202, a second capacitor $C_{B1\_b}$ coupling a voltage supply $V_{DD\_CMP}$ for the comparator circuit 202 to the positive input terminal A of the comparator circuit 202, and a third capacitor $C_{B1\_c}$ coupling a switched voltage node $V_{SW}$ to the positive input terminal A of the comparator circuit 202. The second capacitive divider branch similarly includes a fourth capacitor $C_{B2\_a}$ coupling the negative input terminal INN to the negative input terminal B of the comparator circuit, a fifth capacitor $C_{B2\_b}$ coupling the voltage supply $V_{DD\_CMP}$ for the comparator circuit 202 to the negative input terminal B of the comparator circuit 202, and a sixth capacitor $C_{B2\_c}$ coupling the switched voltage node $V_{SW}$ to the negative input terminal B of the comparator circuit 202.

In one embodiment, the comparator circuit 202 includes a differential pair of transistors MA, MB such as PMOS transistors for outputting an amplified version (OUT_A, OUT_B) of the modulated signal in the $V_{DD\_CMP}$ voltage domain. The comparator circuit 202 also includes a converter circuit for converting the amplified version of the modulated signal into a rail-to-rail digital output signal (CMP_OUT) which is a replica, in the $V_{DD\_CMP}$ voltage domain, of the digital control signal from which the modulated signal is generated in the first voltage domain by the input/modulator 104 of the level shifter system 100. The converter circuit may include, for example, a PMOS current source 206 and a respective NMOS transistor MC, MD for each leg of the PMOS current source 206.

The capacitive-coupled level shifter 102 may also include a resistor ladder connected between the voltage supply $V_{DD\_CMP}$ for the comparator circuit 202 and the switched voltage node $V_{SW}$. The resistor ladder fixes the DC biasing point of the positive and the negative inputs A, B of the comparator circuit 202, whereas the differential pair of transistors MA, MB of the comparator circuit 202 provides a high common mode rejection ratio, amplifying the input signal vab present across the the positive and the negative inputs A, B of the comparator circuit 202 by the voltage gain of the comparator circuit 202 which is given by:

$$|Av| = g_{mp} \times R \qquad (1)$$

where $g_{mp}$ is the gain of the differential pair of transistors MA, MB and R is the resistance of the resistor included in each leg of the differential pair of transistors MA, MB.

In one embodiment, the resistor ladder includes a first resistor R0, a second resistor R1 and a third resistor R2 connected in series. The first resistor R0 is electrically connected between the voltage supply $V_{DD\_CMP}$ for the comparator circuit 202 and a first terminal of the second resistor R1. The third resistor R2 is electrically connected between the switched voltage node $V_{SW}$ and a second terminal of the second resistor R1. The first terminal of the second resistor R1 is electrically connected to the negative input terminal B of the comparator circuit 202, and the second terminal of the second resistor R1 is electrically connected to the positive input terminal A of the comparator circuit. In one embodiment, the first resistor R0 and the third resistor R2 of the resistor ladder are approximately equal, and the second resistor R1 is less than the first resistor R0 and the third resistor R2.

The capacitive-coupled level shifter 102 provides reliable operation since the resistor ladder fixes the DC biasing point of the positive and the negative inputs A, B of the comparator circuit 202. The capacitive-coupled level shifter 102 uses no high voltage cascade devices, resulting in better modelling and less parasitic bipolar to be extracted. The capacitive-coupled level shifter 102 occupies less area than a transformer based level shifter and reduces voltage stress since the input/modulator 104 and output/SR latch 106 of the level shifter system 100 are different voltage domains with dedicated low-dropout linear regulators. The capacitive-coupled level shifter 102 supports high speed operation and fast propagation delay, since the level shifter 102 has less spread over technology corners and temperature. The capacitive-coupled level shifter 102 is suitable for different applications and switching behaviors such as resonant ZVS (zero-voltage switching) or ZCS (zero-current switching) converters, hard switched topologies, etc. due to the high common mode rejection achieved. The capacitive-coupled level shifter 102 is stable with high modularity, and no extra pins/connections are required beside what already available in a standard driver.

Described next are two different techniques for implementing capacitive coupled level shifting in a level shifter system. In the first technique, on-off keying (OOK) modulation and two capacitive coupled level shifters are used to implement capacitive coupled level shifting. In the second technique, a single fully differential capacitive coupled level shifter with OOK modulation is used to implement capacitive coupled level shifting.

Figure 3:
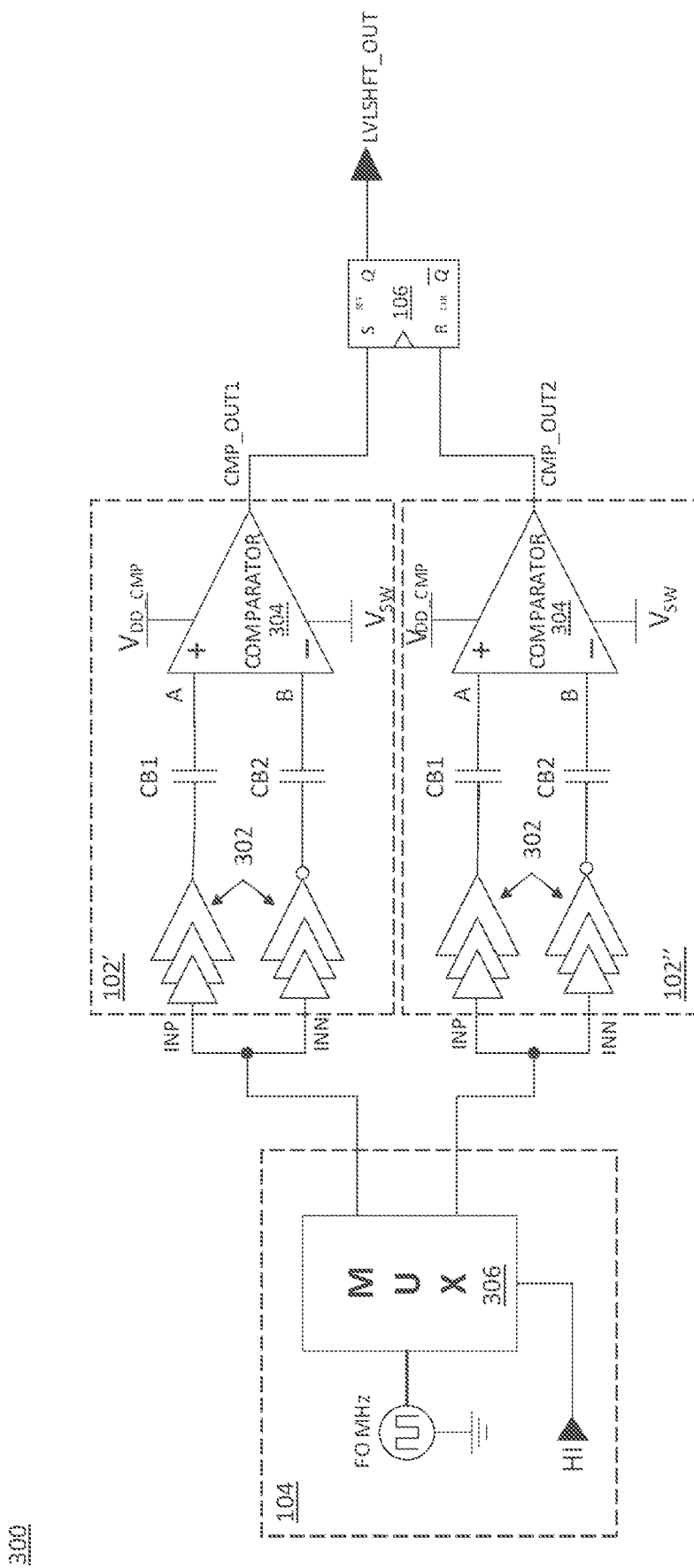
FIG. 3 illustrates a block diagram of an embodiment of a level shifter system that employs on-off keying modulation and two capacitive coupled level shifters for implementing capacitive coupled level shifting.

FIG. 3 illustrates an embodiment of a level shifter system 300 that employs the first technique in which OOK modulation and two capacitive coupled level shifters 102 are used to implement capacitive coupled level shifting. Each instance of a capacitive coupled level shifter 102', 102" shown in FIG. 3 is implemented as shown in FIG. 2, and illustrated with less detail in FIG. 3. For example, the input 200 of each capacitive-coupled level shifter 102', 102" is illustrated as a pair of inverter stages 302, the capacitive divider branches are each illustrated as a respective capacitor $C_{B1}$, $C_{B2}$, and the comparator circuit 202 is illustrated as a simplified differential comparator block 304.

According to the first capacitive coupled level shifting technique, no reference terminal is provided between the positive input terminal INP and the negative input terminal INN of each capacitive-coupled level shifter 102', 102", and no common mode reference terminal is provided between the positive input terminal A and the negative input terminal B of the respective comparator circuits 202.

The input/modulator 104 of the level shifter system 300 modulates a carrier 'FO MHz' with a digital control signal 'HI' to form a continuous sequence of pulses and a multiplexer (MUX) 306 which inputs the continuous sequence of pulses as a modulated signal to the input of the corresponding capacitive-coupled level shifter 102', 102" based on the state of the digital control signal, as will be described in more detail below. The output/SR latch 106 of the level shifter system has a set input electrically connected to the output 'CMP_OUT1' of the first capacitive-coupled level shifter 102' and a reset input electrically connected to the output 'CMP_OUT2' of the second capacitive-coupled level shifter 102". The output/SR latch 106 outputs a level-shifted signal 'LVLSHFT_OUT' based on the state of the set and reset inputs of the output/SR latch 106.

According to this embodiment, the modulated signal input to the two capacitive-coupled level shifters 102', 102" is differential between the positive and negative input terminals INP, INN of the respective level shifter inputs 200. Depending on the state of the modulated carrier, a '1' or '0' is sent to the set or the reset input of the output/SR latch 106 to ensure that the output LVLSHFT_OUT in the level shifted voltage domain follows the digital control signal HI.

The static digital control signal HI is thus translated or modulated with an on-off keying scheme in a continuous sequence of pulses which refresh the state of the output/SR latch 106 of the level shifter system 300, to prevent false triggering due to noise. The repetition rate is defined by application conditions such as switching frequency and duty cycle and may translate to sub-nanosecond requirements. As such, oscillator frequency, which represents the carrier FO, is a design parameter chosen in accordance with the current consumption budget and application constraints.

The level shifter system 300 shown in FIG. 3 has two paths for the set and reset inputs of the output/SR latch 106, with two symmetric capacitive-coupled level shifters 102', 102" of the kind shown in FIG. 2 completing the paths. A high level of symmetry is used for the two capacitive-coupled level shifters 102', 102" to ensure the same or nearly the same propagation delay for signal rising and falling edges, in tracking with process and temperature. Mismatch of propagation delay represents a figure of merit for many power applications influencing the minimum dead-time usable and therefore the overall efficiency of the system, and is preferably minimized.

Figure 4:
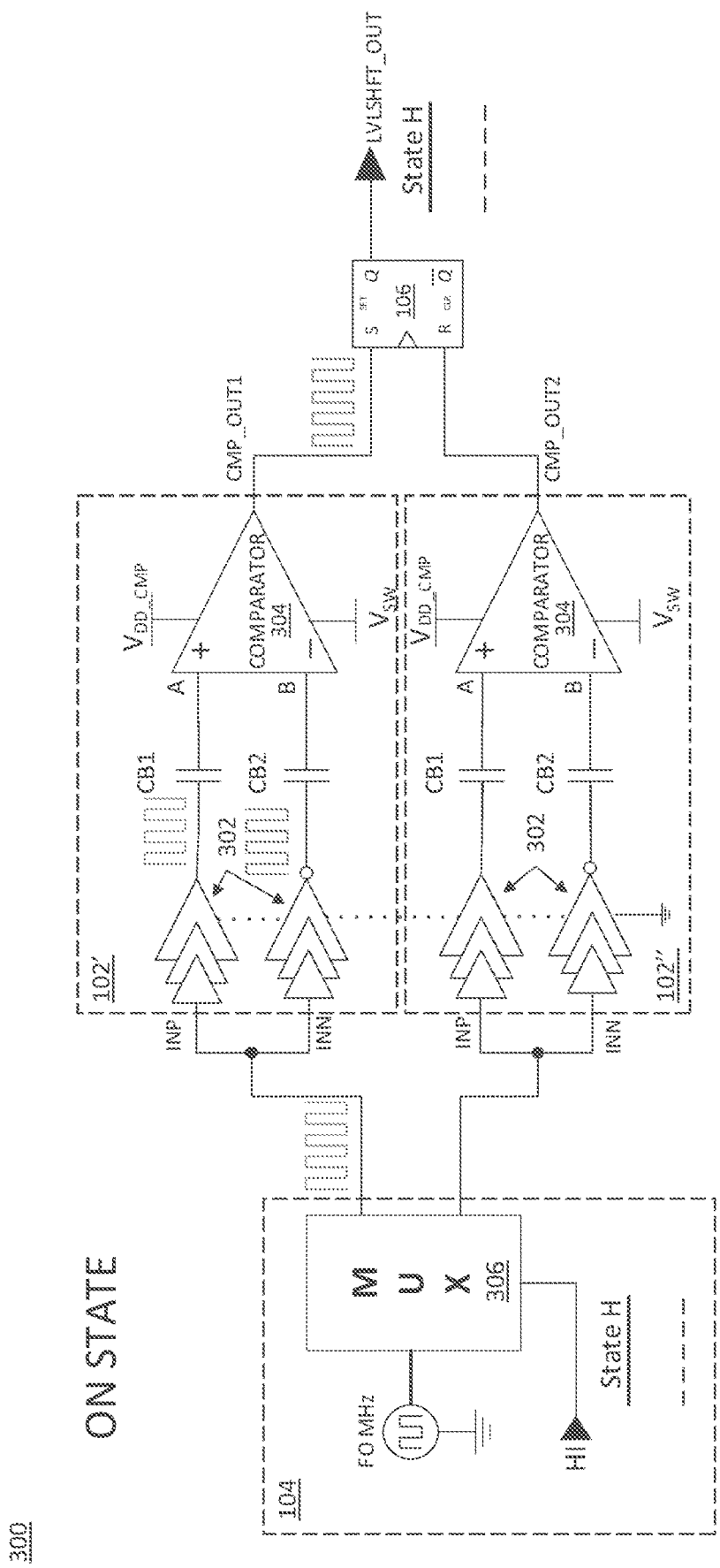
FIGS. 4 and 5 illustrate modes of operation for set and reset states of the level shifter system output/SR latch shown in FIG. 3, respectively.
Figure 5:
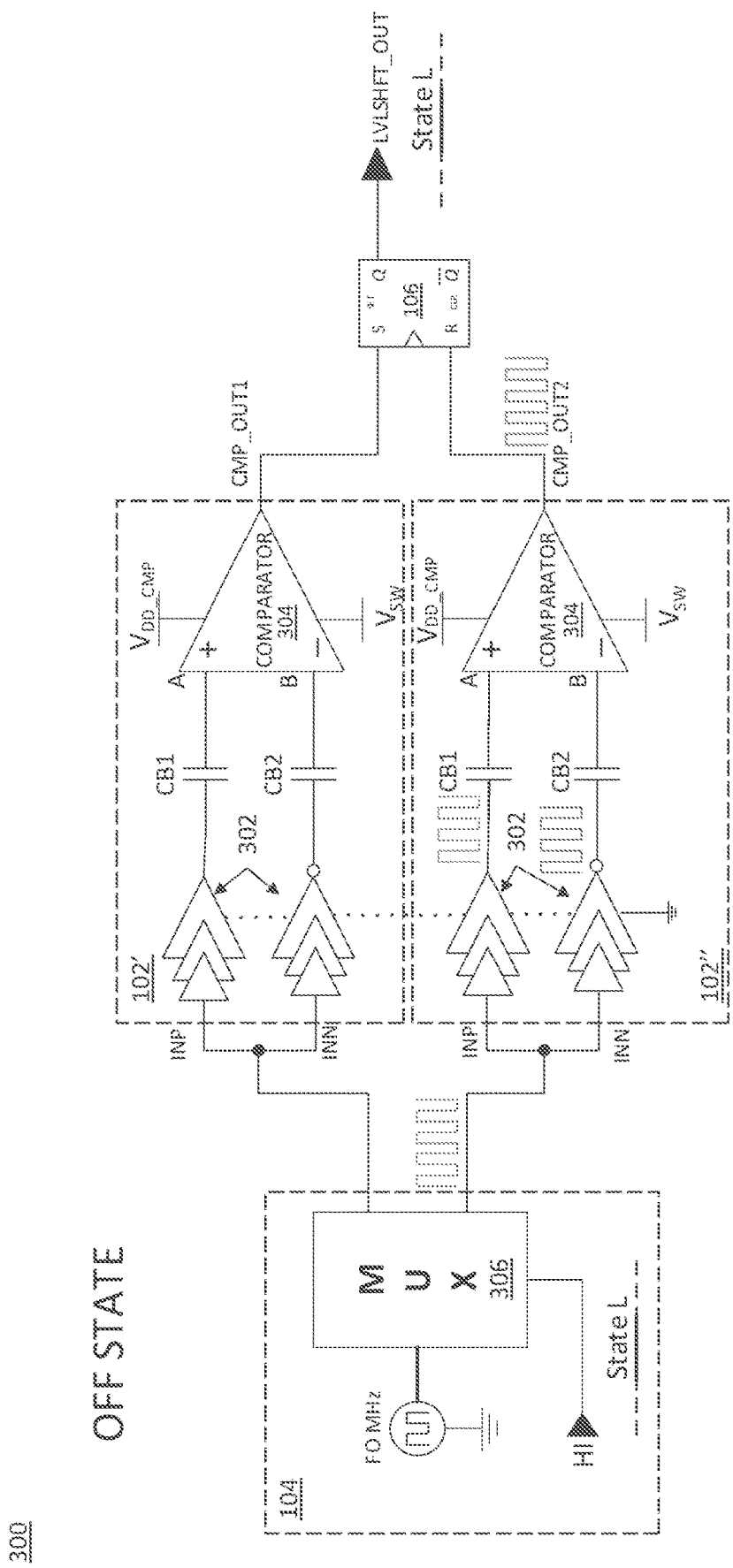

FIGS. 4 and 5 illustrate the modes of operation for the set and reset states of the level shifter system output/SR latch 106, respectively. FIG. 4 shows the mode of operation for the ON or set state. The ON or set state corresponds to when the static digital control signal HI is in a high state such as a logic '1'. FIG. 5 shows the mode of operation for the OFF or reset state. The OFF or reset state corresponds to when the static digital control signal HI is in a low state such as a logic '0'. The first (upper) capacitive-coupled level shifter 102' drives the set input of the out/SR latch 106 when the static digital control signal HI is in a high state, and the second (lower) capacitive-coupled level shifter 102" drives the reset input of the out/SR latch 106 when the static digital control signal HI is in a low state.

The input/modulator 104 of the level shifter system 300 uses the modulated signal to drive the symmetric capacitive-coupled level shifters 102', 102" differentially as shown in FIGS. 4 and 5. If $V_{DD}^{TX}$ is the supply voltage of the input/modulator 104 of the level shifter system 300, the total differential input signal (in AC) to drive the symmetric capacitive-coupled level shifters 102', 102" can be expressed as follows:

$$\Delta v_{IN} = \Delta v_{INP} - \Delta v_{INN} \cong 2 \times V_{DD}^{TX} \quad (2)$$

Equation (2) represents the total differential input voltage signal of the input/modulator 104 of the level shifter system 300, and defines the SNR (signal-to-noise ratio) of the level shifter system 300. As such, $V_{DD}^{TX}$ should be chosen as a tradeoff between optimal SNR and available current budget at a specific oscillator frequency.

Indeed, the average current consumption only for the input side of the level shifter system 300 is given by:

$$\langle I_{DD}^{TX} \rangle \propto C_L \times V_{DD}^{TX} \times f_{osc} \quad (3)$$

where $C_L$ represents the total equivalent load capacitance of the inverter stages 302 of the symmetric capacitive-coupled level shifters 102', 102".

The capacitive divider 204 of each capacitive-coupled level shifter 102', 102" formed by the respective capacitive divider branches (capacitors $C_{B1\_a}$ through $C_{B1\_c}$ and capacitors $C_{B2\_a}$ through $C_{B2\_c}$ in FIG. 2) implement a high pass transfer function from the input side to the output side of the level shifters 102', 102". The capacitive divider 204 of each capacitive-coupled level shifter 102', 102" blocks any DC component of the modulated input signal toward the input side of the comparator circuit 202, while allowing the differential mode to pass through, reaching the differential pair of transistors MA, MB of the comparator circuit 202 which is the gain stage of the level shifters 102', 102". Due to the symmetry of the capacitive divider branches of each capacitive-coupled level shifter 102', 102", the positive input terminal A and the negative input terminal B of the respective comparator circuit 202 stays at $\approx V_{DD}^{RX}/2$, with the DC biasing being defined by the respective resistor ladder formed by resistors R0, R1 and R2.

The common mode variation at the positive and negative input terminals A, B of each comparator circuit 202 is rejected by the corresponding differential pair of transistors MA, MB of that comparator circuit 202, which instead amplifies the equivalent differential signal coming from the input side of the level shifter 102', 102".

The attenuation factor $\alpha_c$ of the capacitive divider 204 may be defined as follows:

$$\alpha_C = \frac{c_{TX}}{c_{TX} + 2 \times C_{RX}} \cong \frac{c_{TX}}{2 \times C_{RX}} \ll 1 \text{ in case } C_{TX} \ll C_{RX} \quad (4)$$

where $C_{B1\_a} = C_{B2\_a} = C_{TX}$, and $C_{B1\_b} = C_{B1\_c} = C_{B2\_b} = C_{B2\_c} = C_{RX}$.

With the proper choice of resistors R0, R1 and R2 of the resistor ladder, the equivalent input voltage signals at the positive and negative input terminals A, B of the comparator circuit 202 can be expressed as follows:

$$v_a \cong \alpha_c \times v_{INP} \quad (5)$$

$$v_b = \alpha_c \times v_{INN} \quad (6)$$

The input signals at the positive and negative input terminals A, B of the comparator circuit 202 can be decomposed as common mode $v_{cm}$ and differential mode $V_d$ to obtain:

$$v_{INP} = v_{cm} + v_d/2 \quad (7)$$

$$v_{INN} = v_{cm}/2 \quad (8)$$

Equations (7) and (8) can be substituted into equations (5) and (6) to obtain the equivalent differential input voltage at the input side of the comparator circuit 202, expressed as follows:

$$v_{ab} \cong \alpha_c \times (v_{INP} v_{INN}) = \alpha_c \times v_d = 2 \times \alpha_c \times V_{DD}^{TX} \quad (9)$$

Equation (9) reveals that, by including the capacitive divider 204 in each capacitive-coupled level shifter 102', 102", the differential input voltage at the input side of the corresponding level shifter 102', 102" is proportional to only the differential output voltage of the output side of the level shifter 102', 102". The common mode voltage is cancelled out due to the symmetry in capacitor $C_{B1\_a}$ and $C_{B2\_a}$ of each capacitive divider 204. This property is fundamental in applications with high voltage, high switching speed of the switched voltage node $V_{SW}$, e.g., in DC-DC converters having hard switched topologies. Moreover, capacitors $C_{B1\_b}$, $C_{B1\_c}$, $C_{B2\_b}$ and $C_{B2\_c}$ of the capacitive divider enhance the power supply rejection ratio of the comparator circuit 202, acting as a high pass filter for supply and ground noise.

The resistor ladder formed by resistors R0, R1 and R2 connected in series provides the DC biasing of the comparator circuit 202, ensuring a stable output state when modulation is not applied at the input 200 of the respective capacitive-coupled level shifter 102', 102". As such, a proper voltage hysteresis should be guaranteed as given by:

$$R_1 < R_0 = R_2 \rightarrow V_{hyst} = \frac{R_1}{R_0 + R_1 + R_2} \times V_{DD}^{RX} \quad (10)$$

In one embodiment, the hysteresis voltage is chosen based on the ±6σ sigma equivalent input offset of the comparator circuit 202 and based on the differential signal expressed by equation (9), as given by:

$$6 \times \sigma_{VOS}^{RX} < V_{hyst} < 2 \times \alpha_c \times V_{DD}^{TX} \quad (11)$$

According to equation (11), the voltage hysteresis of each capacitive-coupled level shifter 102', 102" may be greater than the 6σ sigma equivalent input offset of the comparator circuit 202 and less than the modulated signal input to the comparator circuit 202 with a common mode voltage ($v_{cm}$) of the modulated signal cancelled out. The input signal $v_{ab}$ across the positive and negative input terminals A, B of the comparator circuit 202 and expressed in equation (9) is amplified by the differential pair of transistors MA, MB of the comparator circuit 202, yielding the voltage gain |Av| expressed in equation (1).

Figure 6:
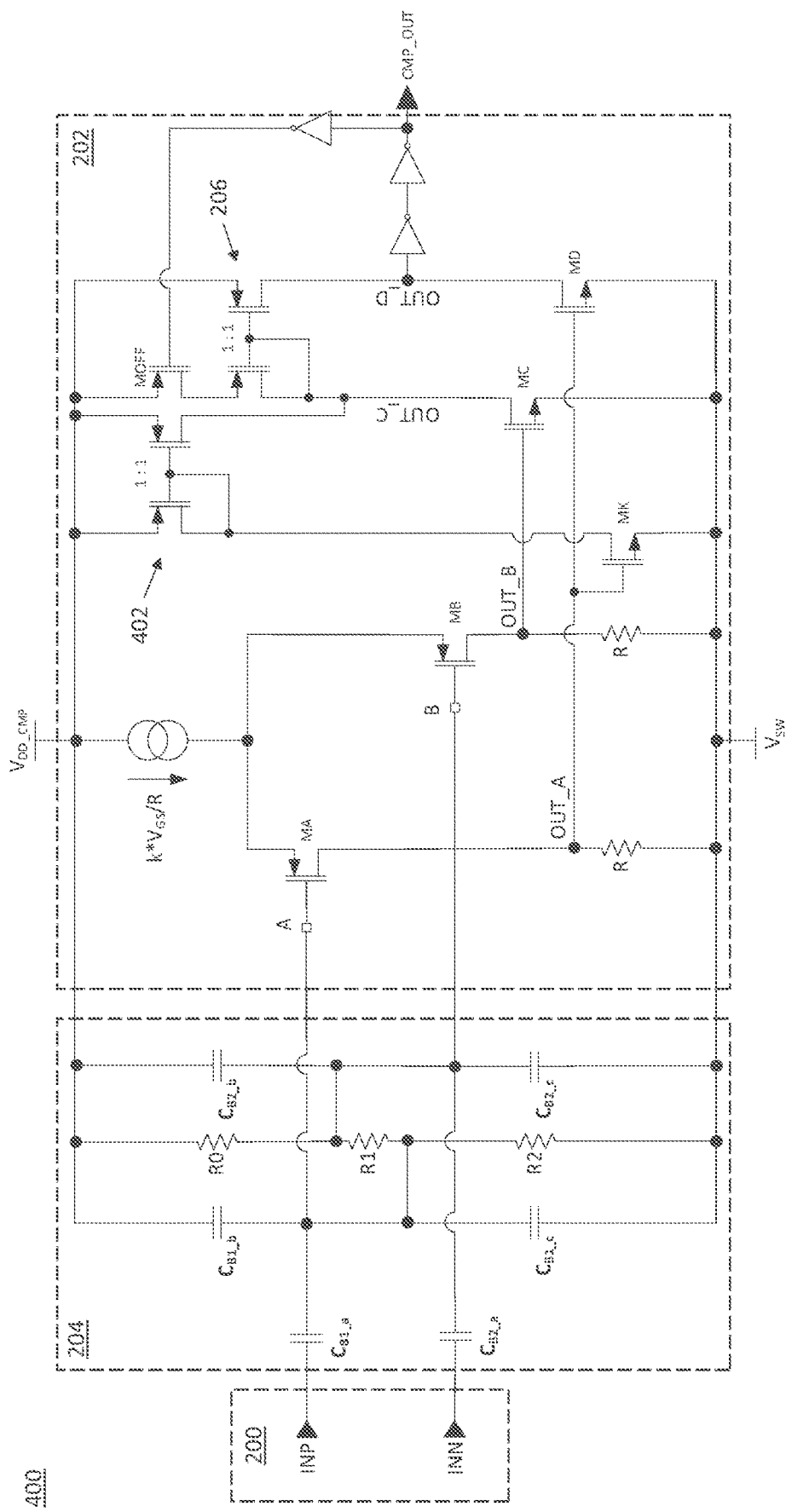
FIG. 6 illustrates a circuit schematic of another embodiment of a capacitive-coupled level shifter.

FIG. 6 illustrates another embodiment of a symmetric capacitive-coupled level shifter 400 which may be used in the level shifter systems 100, 300 shown in FIGS. 1 and 3. The embodiment shown in FIG. 6 is similar to the embodiment illustrated in FIG. 2. Different, however, the capacitive-coupled level shifter 400 shown in FIG. 6 also includes a speed booster circuit for increasing gain of the converter circuit of the capacitive-coupled level shifter 400. In one embodiment, the speed booster circuit includes a PMOS current source 402 electrically connected in series with an NMOS switch MK between the voltage supply $V_{DD\_CMP}$ for the comparator circuit 202 and the switched voltage node $V_{SW}$, and a PMOS switch MOFF configured to enable or disable the PMOS current source 206 of the converter circuit based on the state of the rail-to-rail digital output signal CMP_OUT provided by the converter circuit.

The comparator circuit 202 of the capacitive-coupled level shifter 400 is effectively a voltage amplifier, and by means of transistors MC and MD converts the amplified differential voltage OUT_A–OUT_B into a rail to rail digital output signal OUT_D which is a replica, in the level shifted domain, of the low side input control signal HI. The speed booster circuit shown in FIG. 6 increases the gain of the comparator circuit 202, enhancing speed performance of the comparator circuit 202 while maintaining almost the same current consumption. With the proposed architecture, propagation delays rise and fall in the sub nanosecond range.

Figure 7:
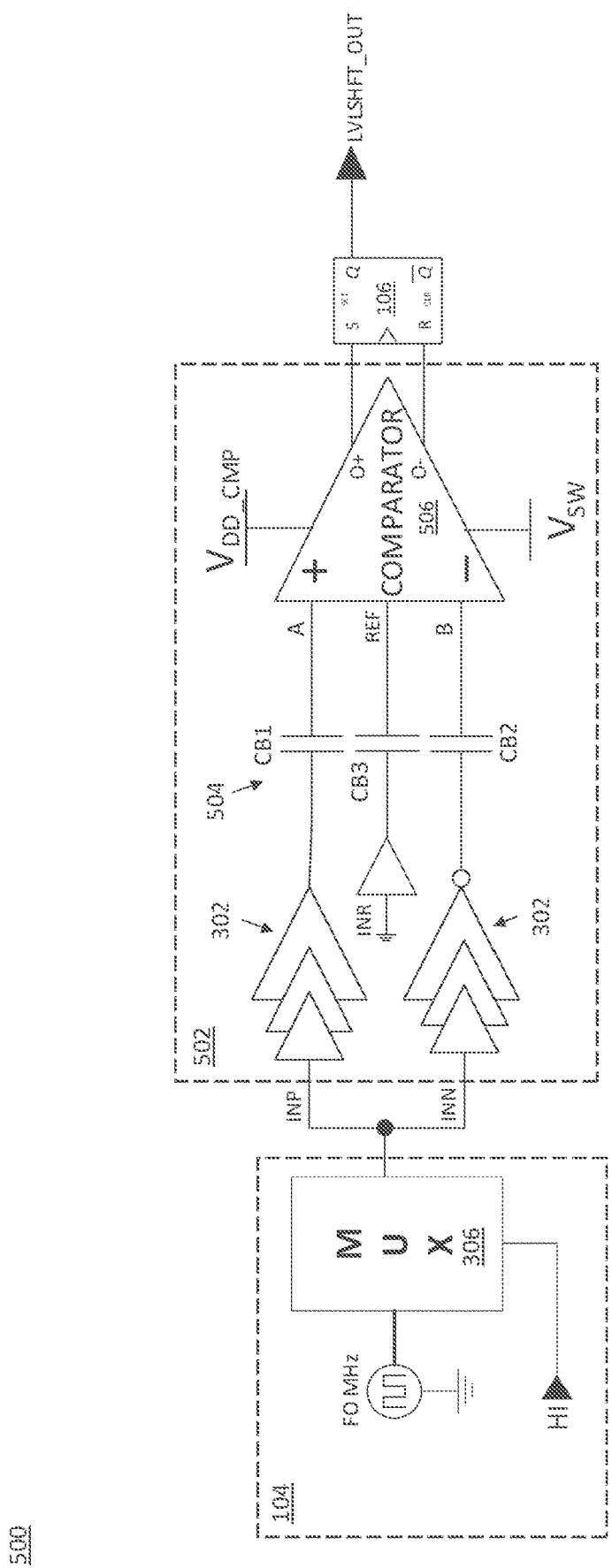
FIG. 7 illustrates a block diagram of an embodiment of a level shifter system that employs on-off keying modulation and a single fully differential capacitive coupled level shifter for implementing capacitive coupled level shifting.

FIG. 7 illustrates an embodiment of a level shifter system 500 that employs the second OOK modulation-based capacitive coupled level shifting technique. Different than the embodiment illustrated in FIG. 3, a single fully differential capacitive coupled level shifter 502 is used. According to this embodiment, the input 302 of the fully differential capacitive coupled level shifter 502 also has a reference terminal INR and the capacitive divider circuit 504 has a corresponding third capacitive divider branch. The third capacitive divider branch couples the reference terminal INR to a common mode reference terminal 'REF' of the comparator circuit 506 of the fully differential capacitive coupled level shifter 502. The third capacitive divider branch is illustrated as a capacitor CB3 in FIG. 7. The modulated signal input to the fully differential capacitive coupled level shifter 502 from the input/modulator 104 of the level shifter system 500 is single-ended between the positive input terminal INP and the reference terminal INR, and between the negative input terminal INN and the reference terminal INR.

The positive output O+ of the comparator circuit 506 of the fully differential capacitive coupled level shifter 502 is electrically connected to the set input S of the output/SR latch 106 of the level shifter system 500, and the negative output O− of the comparator circuit 506 is electrically connected to the reset input R of the output/SR latch 106. The output/SR latch 106 outputs a level-shifted signal 'LVLSHFT_OUT' based on the state of the set and reset inputs of the output/SR latch 106, which in turn depends on whether the positive output O+ or the negative output O− of the comparator circuit 506 is carrying the level-shifted signal.

Figure 8:
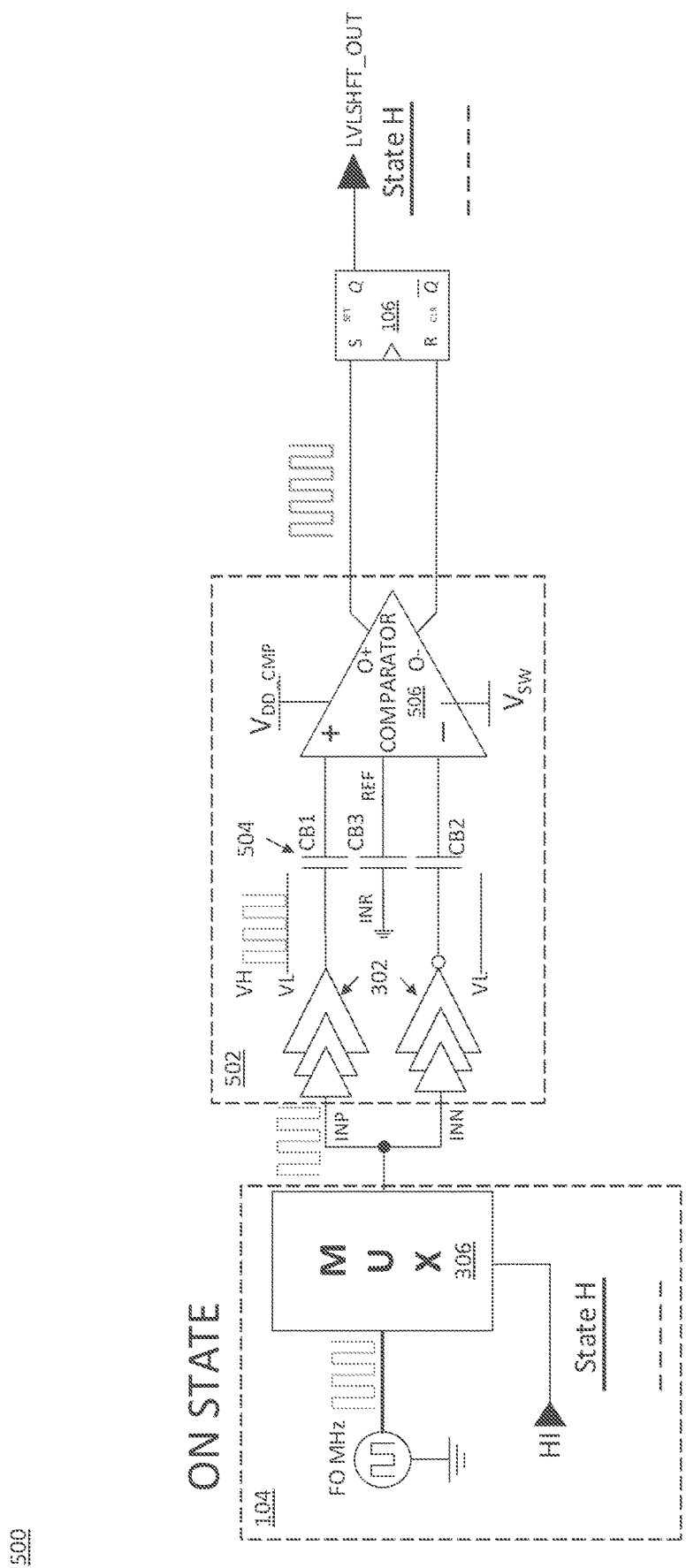
FIGS. 8 and 9 illustrate modes of operation for set and reset states of the level shifter system output/SR latch shown in FIG. 7, respectively.
Figure 9:
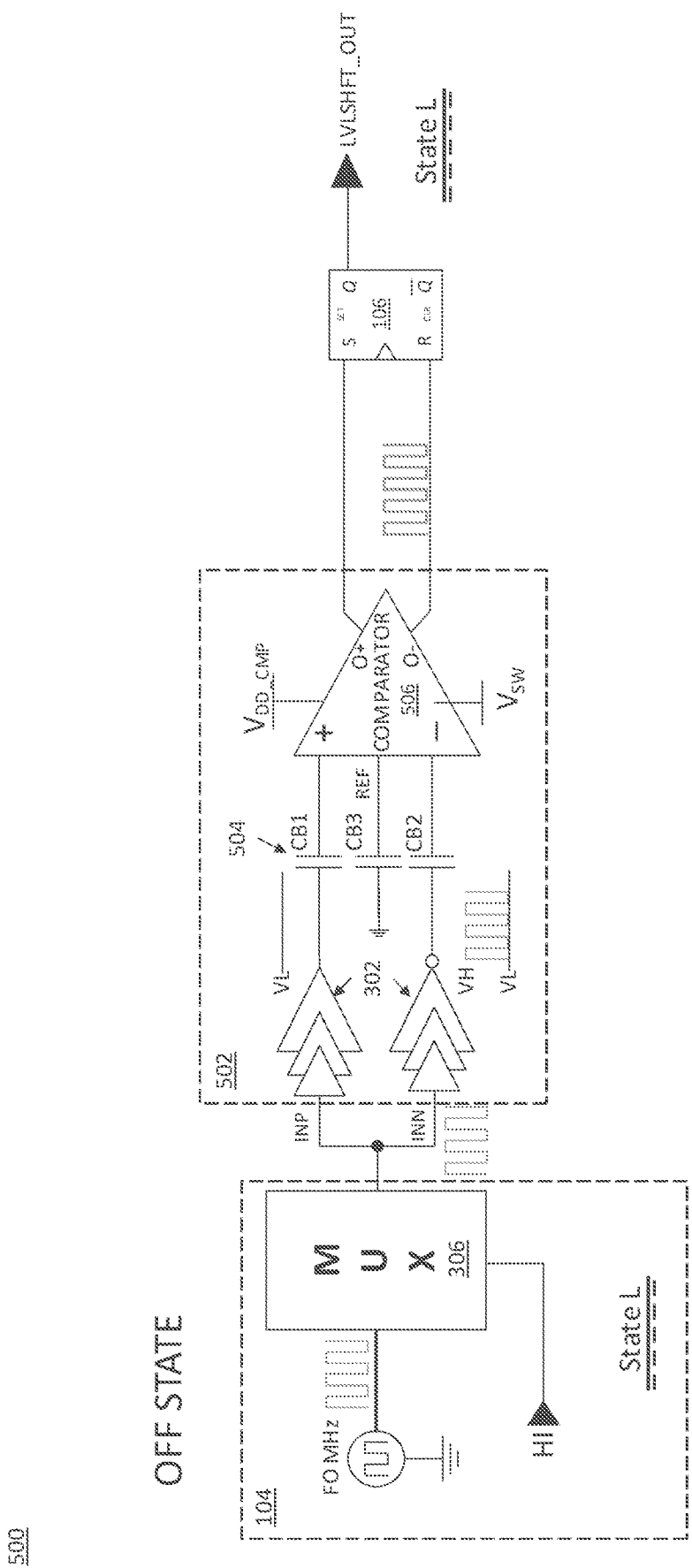

FIGS. 8 and 9 illustrate the modes of operation for the set and reset states of the level shifter system output/SR latch 106, respectively, for the single fully differential capacitive coupled level shifter 502 shown in FIG. 7. FIG. 8 shows the mode of operation for the ON or set state. The ON or set state corresponds to when the static digital control signal HI is in a high state such as a logic '1'. FIG. 9 shows the mode of operation for the OFF or reset state. The OFF or reset state corresponds to when the static digital control signal HI is in a low state such as a logic '0'. The multiplexer 306 of the input/modulator 104 of the level shifter system 500 controls whether the positive (upper) or negative (lower) path of the fully differential capacitive-coupled level shifter 502 drives the output/SR latch 106 of the level shifter system 500, based on the state of the static digital control signal HI.

The positive path of the fully differential capacitive-coupled level shifter 502 drives the set input of the output/SR latch 106 when the static digital control signal HI is in a high state, via the pulses received at the positive input terminal INP. The pulses propagating along the positive path of the fully differential capacitive-coupled level shifter 502 are referenced to the common mode reference terminal REF of the comparator circuit 506 via the reference terminal INR and thus are single-ended, transitioning from a high voltage level VH to a low voltage level VL.

The negative path of the fully differential capacitive-coupled level shifter 502 drives the reset input of the output/SR latch 106 when the static digital control signal HI is in a low state, via the pulses received at the negative input terminal INN. The pulses propagating along the negative path of the fully differential capacitive-coupled level shifter 502 are also referenced to the common mode reference terminal REF of the comparator circuit 506 via the reference terminal INR and thus are single-ended, transitioning from the high voltage level VH to the low voltage level VL.

The capacitive coupled level shifting technique illustrated in FIGS. 7 through 9 uses the same fully differential capacitive-coupled level shifter 502 between the input/modulator 104 and the output/SR latch 106 of the level shifter system 500. The OOK modulation in this case is single ended, as explained above.

Compared to the capacitive coupled level shifting technique illustrated in FIGS. 3 through 5 which uses two symmetric capacitive-coupled level shifters 102', 102" between the input/modulator 104 and output/SR latch 106 of that level shifter system 300, the capacitive coupled level shifting technique illustrated in FIGS. 7 through 9 reduces the signal path between the input/modulator 104 and output/SR latch 106 to a single channel. Using a single fully differential capacitive-coupled level shifter 502 at the input side of the level shifter system 500 allows for a reduction in current consumption and layout area, but with added complexity in the cell design.

Figure 10:
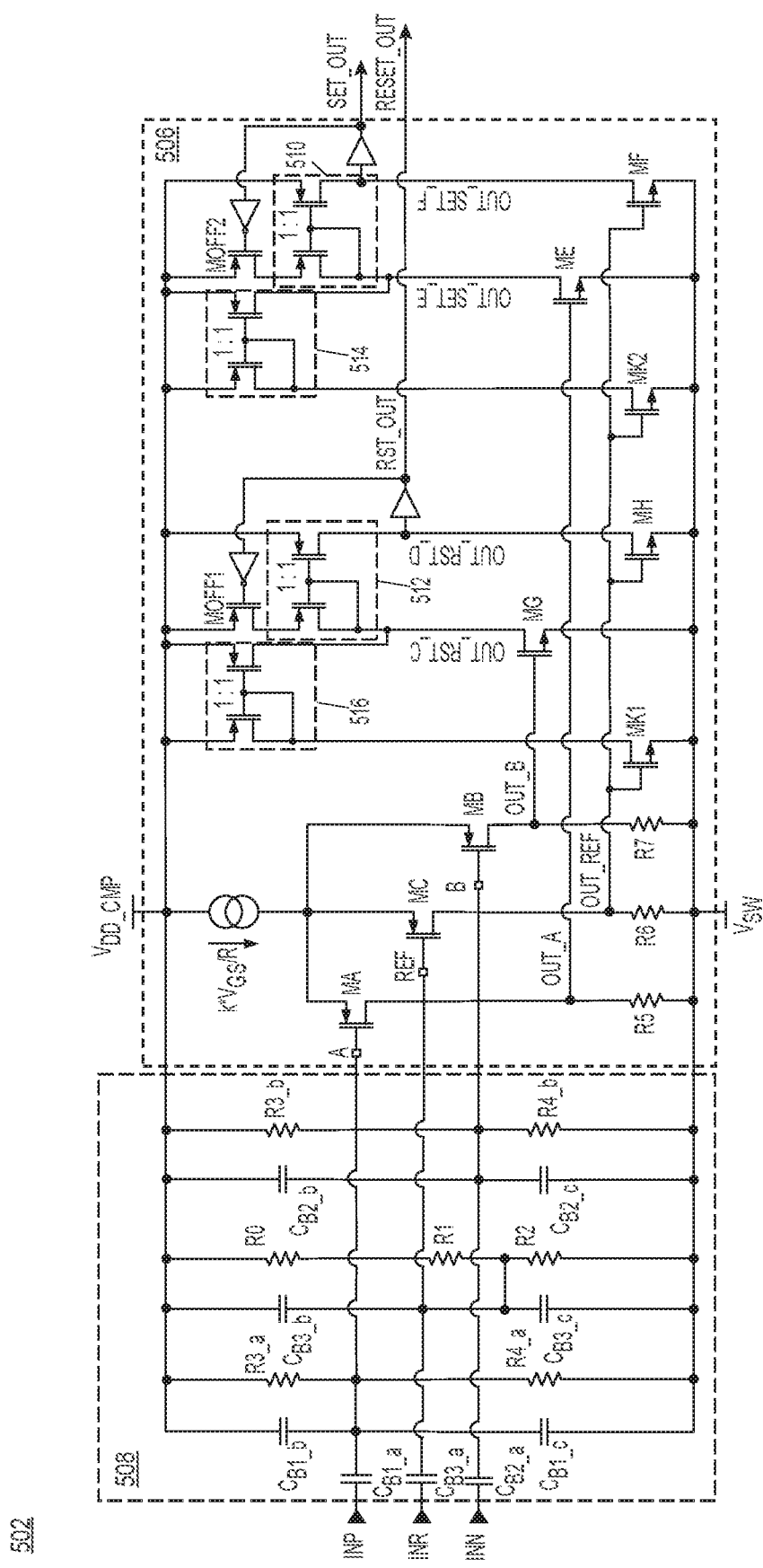
FIG. 10 illustrates a circuit schematic of an embodiment of a fully differential capacitive-coupled level shifter.

FIG. 10 illustrates an embodiment of the cell design for the fully differential capacitive-coupled level shifter 502 shown in FIG. 7. The capacitive divider circuit 508 of the fully differential capacitive-coupled level shifter 502 is similar to the capacitive divider circuit 204 of the capacitive-coupled level shifters 102, 400 shown in FIGS. 2 and 6. Different, however, the capacitive divider circuit 508 of the fully differential capacitive-coupled level shifter 502 illustrated in FIG. 10 also has a third capacitive divider branch coupling the reference terminal INR of the level shifter input to the common mode reference terminal REF of the comparator circuit 506. The third capacitive divider branch includes a capacitor $C_{B3\_a}$ coupling the reference input terminal INR to the reference terminal REF of the comparator circuit 506, a capacitor $C_{B3\_b}$ coupling the voltage supply $V_{DD\_CMP}$ for the comparator circuit 506 to the reference terminal REF of the comparator circuit 506, and a capacitor $C_{B3\_c}$ coupling the switched voltage node $V_{SW}$ to the reference terminal REF of the comparator circuit 506.

In addition to the resistor ladder formed by resistors R0, R1 and R2 described previously herein in connection with the capacitive coupled level shifting technique illustrated in FIGS. 3 through 5, the fully differential capacitive-coupled level shifter 502 illustrated in FIG. 10 also includes a second resistor ladder connected between the voltage supply $V_{DD\_CMP}$ for the comparator circuit 506 and the switched voltage node $V_{SW}$, and a third resistor ladder connected between the voltage supply $V_{DD\_CMP}$ for the comparator circuit 506 and the switched voltage node $V_{SW}$.

The second resistor ladder includes two resistors R3_b, R4_b connected in series. Resistor R3_b is electrically connected between the voltage supply $V_{DD\_CMP}$ for the comparator circuit 506 and a first terminal of resistor R4_b. A second terminal of resistor R4_b is electrically connected to the switched voltage node $V_{SW}$. The first terminal of resistor R4_b is electrically connected to the negative input terminal B of the comparator circuit 506. The third resistor ladder also includes two resistors R3_a, R4_a connected in series. Resistor R3_a is electrically connected between the voltage supply $V_{DD\_CMP}$ for the comparator circuit 506 and a first terminal of resistor R4_a. A second terminal of resistor R4_a is electrically connected to the switched voltage node $V_{SW}$. The first terminal of resistor R4_a is electrically connected to the positive input terminal A of the comparator circuit 506.

The basic operational principles of the fully differential capacitive-coupled level shifter 502 illustrated in FIG. 10 are essentially the same as for the capacitive-coupled level shifters 102, 400 shown in FIGS. 2 and 6. Hence, the equations and formulations described above are valid the fully differential capacitive-coupled level shifter 502 illustrated in FIG. 10.

The main difference with the fully differential capacitive-coupled level shifter 502 illustrated in FIG. 10 is that the comparator circuit 506 has three input paths: path A which is the set path for the output/SR latch 106 of the level shifter system 500 when modulation is applied to path A; path B which is the reset path for the output/SR latch 106 when modulation is applied to path B; and a reference path which defines the dominant state low of the comparator outputs OUT_A, OUT_B when both path A and path B are not in the modulation mode.

Path A of the comparator circuit 506 includes a first differential pair of transistors MA, MC configured to output a first amplified version of the modulated signal applied between the positive input terminal A and the common mode reference terminal REF of the comparator circuit 506. Path B of the comparator circuit 506 includes a second differential pair of transistors MB, MC configured to output a second amplified version of the modulated signal applied between the negative input terminal B and the common mode reference terminal REF of the comparator circuit 506.

The comparator circuit 506 also includes a first PMOS current source 510 electrically connected to a first NMOS switch ME driven by a positive output OUT_A of the first differential pair of transistors MA, MC and electrically connected to a second NMOS switch MF driven by a common reference output OUT_REF of the first and second differential pairs of transistors MA/MC, MB/MC. The comparator circuit 506 further includes a second PMOS current source 512 electrically connected to a third NMOS switch MG driven by a negative output OUT_B of the second differential pair of transistors MB, MC and electrically connected to a fourth NMOS switch MH driven by the common reference output OUT_REF.

The modulation scheme may use, e.g., on-off keying (OOK) and is single-ended, meaning that only path A or path B of the comparator circuit 506 carries the modulated signal at a point in time, thus reducing the current draw. As a consequence, both differential signals $v_{a\text{-}ref}$ and $v_{b\text{-}ref}$ at the input side of the comparator circuit 506 are reduced by half with respect to equation (9) by using differential OOK modulation, thus SNR degrades by −6 dB when compared to the capacitive-coupled level shifter implementations shown in FIGS. 2 and 6.

The hysteresis voltage is still determined by the first resistor ladder formed by resistors R0, R1 and R2 and in accordance with equation (10). The resistors of the second and third resistor ladders adhere to the following conditions:

$$R_3 = R_4 \text{ and } R_0 + R_1 + R_2 = R_3 + R_4 \quad (12)$$

$$R_5 = R_6 = \quad (13)$$

The fully differential capacitive-coupled level shifter 502 may include two instances of the speed booster circuit previously described herein, for increasing gain of the converter circuit. In one embodiment, the first speed booster circuit includes a PMOS current source 514 electrically connected in series with an NMOS switch MK2 driven by the common reference output OUT_REF of the first and second differential pairs of transistors MA/MC, MB/MC, and a PMOS switch MOFF2 configured to enable or disable the first PMOS current source 510 of the comparator circuit 506 based on a state of a rail-to-rail positive digital output signal which forms the set input to the output/SR latch 106 of the level shifter system 500. The second speed booster circuit similarly includes a PMOS current source 516 electrically connected in series with an NMOS switch MK1 driven by the common reference output OUT_REF, and a PMOS switch MOFF1 configured to enable or disable the second PMOS current source 512 of the comparator circuit 506 based on a state of a rail-to-rail negative digital output signal which forms the reset input to the output/SR latch 106 of the level shifter system 500.

Figure 11:
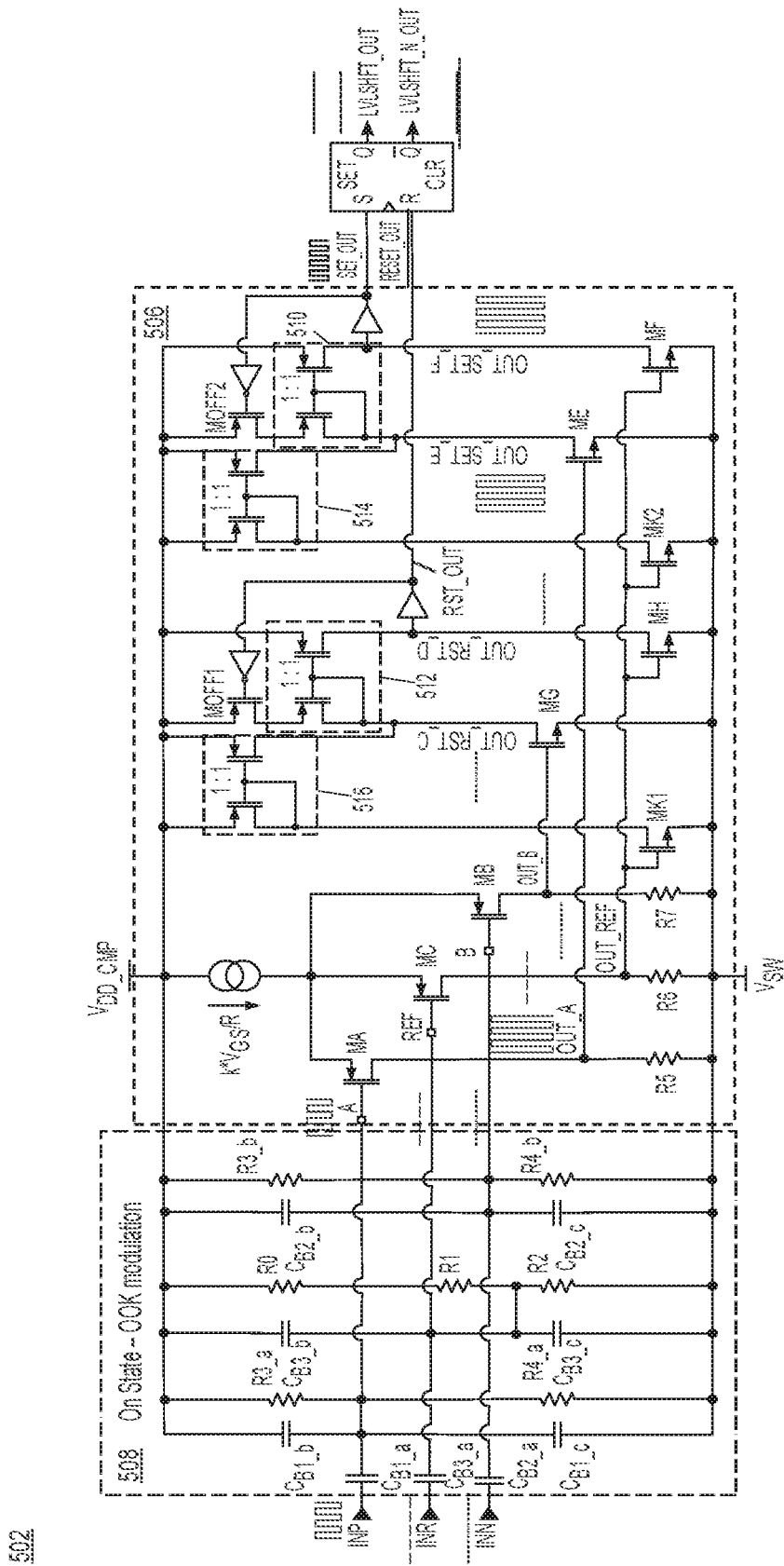
FIG. 11 illustrates a first path of the fully differential capacitive-coupled level shifter while carrying a modulated signal over one time period.

FIG. 11 illustrates path A of the fully differential capacitive-coupled level shifter 502 carrying the modulated signal over one time period.

Figure 12:
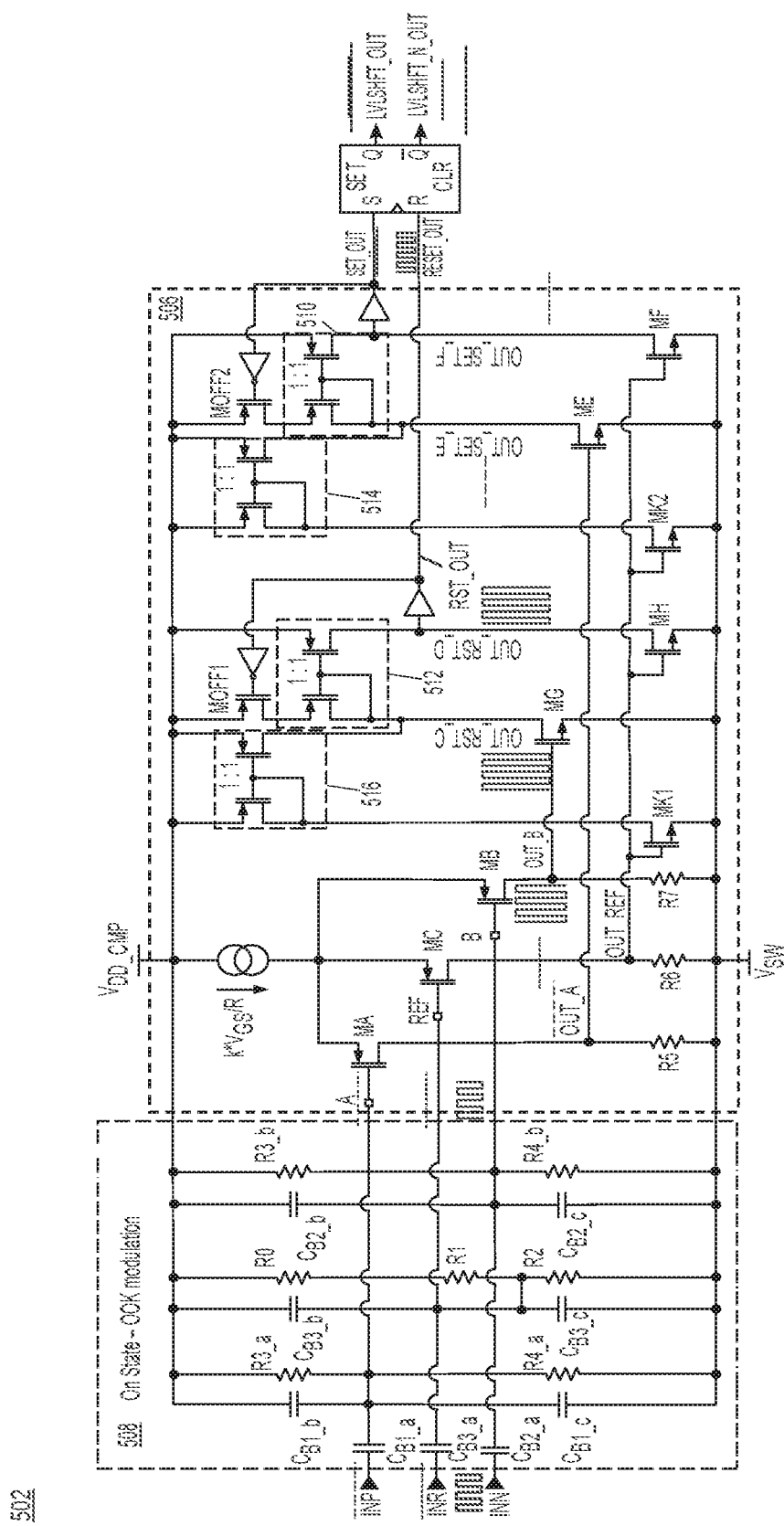
FIG. 12 illustrates a second path of the fully differential capacitive-coupled level shifter while carrying the modulated signal over a different time period.

FIG. 12 illustrates path B of the fully differential capacitive-coupled level shifter 502 carrying the modulated signal over a different time period.

When the static digital control signal HI is in a high state, the input/modulator 104 of the level shifter system 500 applies the modulated signal to the positive input terminal INP of the fully differential capacitive-coupled level shifter 502 as shown in FIG. 11. The modulated signal is amplified by the first differential pair of transistors MA, MC and converted to a rail-to-rail digital output signal SET_OUT which is input to the set terminal S of the input/SR latch 106 of the level shifter system 500.

When the static digital control signal HI is in a low state, the input/modulator 104 of the level shifter system 500 applies the modulated signal to the negative input terminal INN of the fully differential capacitive-coupled level shifter 502 as shown in FIG. 12. The modulated signal is amplified by the second differential pair of transistors MB, MC and converted to a rail-to-rail digital output signal RESET_OUT which is input to the reset terminal R of the input/SR latch 106 of the level shifter system 500.

Figure 13:
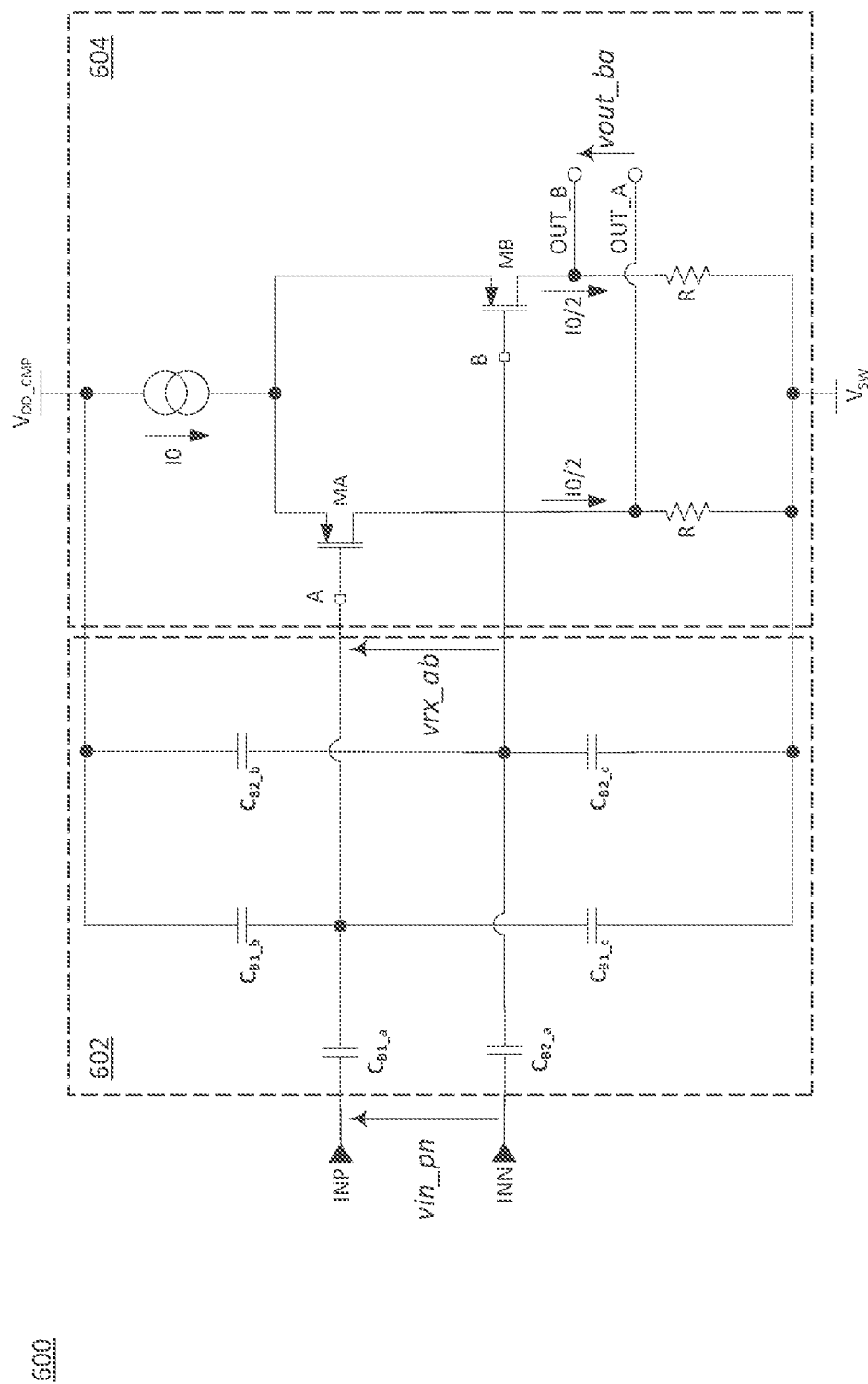
FIG. 13 illustrates a simplified circuit schematic of a capacitive-coupled level shifter.

FIG. 13 illustrates a simplified schematic view of a capacitive-coupled level shifter 600 with just the capacitive divider 602 and a differential pair of transistors MA, MB of the comparator circuit 604. As previously described and analytically demonstrated in equation (9), the equivalent differential input signal $v_{ab}$ at the input side of the differential pair of transistors MA, MB depends only on the differential input signal $v_{in\_pn}$ to the capacitive-coupled level shifter 600, while the common mode voltage $v_{cm}$ of the modulated signal is cancelled out by the symmetry of the capacitive divider 602. In this way, the capacitive-coupled level shifter 600 can always transfer the control signal, in a different power supply domain, even with fast common mode variation. The proposed capacitive-coupled level shifters described herein provide more flexibility than conventional level shifters.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A capacitive-coupled level shifter, comprising:
a capacitive divider circuit comprising a first capacitive divider branch configured to couple a first input terminal to a first comparator terminal and a second capacitive divider branch configured to couple a second input terminal to a second comparator terminal,
wherein the first capacitive divider branch and the second capacitive divider branch are symmetric so as to cancel out a common mode voltage of a modulated signal input to the capacitive divider circuit.

2. The capacitive-coupled level shifter of claim 1, wherein the first capacitive divider branch comprises:
a first capacitor configured to couple the first input terminal to the first comparator terminal;
a second capacitor configured to couple a voltage supply to the first comparator terminal; and
a third capacitor configured to couple a switched voltage node to the first comparator terminal,
wherein the second capacitive divider branch comprises:
a fourth capacitor configured to couple the second input terminal to the second comparator terminal;
a fifth capacitor configured to couple the voltage supply to the second comparator terminal; and
a sixth capacitor configured to couple the switched voltage node to the second comparator terminal.

3. The capacitive-coupled level shifter of claim 2, further comprising a resistor ladder connected between the voltage supply and the switched voltage node.

4. The capacitive-coupled level shifter of claim 3, wherein the resistor ladder comprises a first resistor, a second resistor and a third resistor connected in series, wherein the first resistor is electrically connected between the voltage supply and a first terminal of the second resistor, wherein the third resistor is electrically connected between the switched voltage node and a second terminal of the second resistor, wherein the first terminal of the second resistor is electrically connected to the second comparator terminal, and wherein the second terminal of the second resistor is electrically connected to the first comparator terminal.

5. The capacitive-coupled level shifter of claim 4, wherein the first resistor and the third resistor are approximately equal, and wherein the second resistor is less than the first resistor and the third resistor.

6. The capacitive-coupled level shifter of claim 2, wherein the capacitive divider circuit further comprises a third capacitive divider branch configured to couple a reference input terminal to a common mode comparator reference terminal, and wherein the modulated signal is single-ended between the first input terminal and the reference input terminal, and between the second input terminal and the reference input terminal.

7. The capacitive-coupled level shifter of claim 6, further comprising:
a first resistor ladder connected between the voltage supply and the switched voltage node;
a second resistor ladder connected between the voltage supply and the switched voltage node; and
a third resistor ladder connected between the voltage supply and the switched voltage node,
wherein the first resistor ladder comprises a first resistor, a second resistor and a third resistor connected in series, the first resistor is electrically connected between the voltage supply and a first terminal of the second resistor, the third resistor is electrically connected between the switched voltage node and a second terminal of the second resistor, and the second terminal of the second resistor is electrically connected to the common mode comparator reference terminal,
wherein the second resistor ladder comprises a fourth resistor and a fifth resistor connected in series, the fourth resistor is electrically connected between the voltage supply and a first terminal of the fifth resistor, a second terminal of the fifth resistor is electrically connected to the switched voltage node, and the first terminal of the fifth resistor is electrically connected to the second comparator terminal,
wherein the third resistor ladder comprises a sixth resistor and a seventh resistor connected in series, the sixth resistor is electrically connected between the voltage supply and a first terminal of the seventh resistor, a second terminal of the seventh resistor is electrically connected to the switched voltage node, and the first terminal of the seventh resistor is electrically connected to the first comparator terminal.

8. The capacitive-coupled level shifter of claim 1, further comprising a resistor ladder configured to fix a DC biasing point of the first and the second comparator terminals.

9. The capacitive-coupled level shifter of claim 1, wherein no reference terminal is provided between the first input terminal and the second input terminal, wherein no common mode reference terminal is provided between the first comparator terminal and the second comparator terminal, and wherein the modulated signal is differential between the first input terminal and the second input terminal.

10. The capacitive-coupled level shifter of claim 1, further comprising:
a reference terminal between the first input terminal and the second input terminal; and
a common mode reference terminal between the first comparator terminal and the second comparator terminal,
wherein the modulated signal is single-ended between the first input terminal and the reference terminal, and between the second input terminal and the reference terminal.

11. A level shifter system, comprising:
at least one capacitive-coupled level shifter comprising:
an input having a positive input terminal and a negative input terminal, the input configured to receive a modulated signal in a first voltage domain;
a comparator circuit configured to shift the modulated signal to a second voltage domain higher than the first voltage domain; and
a capacitive divider circuit comprising a first capacitive divider branch coupling the positive input terminal of the input to a positive input terminal of the comparator circuit and a second capacitive divider branch coupling the negative input terminal of the input to a negative input terminal of the comparator circuit, the first capacitive divider branch and the second capacitive divider branch being symmetric so as to cancel out a common mode voltage of the modulated signal;
a modulator configured to modulate a carrier with a digital control signal to form a sequence of pulses, and input the sequence of pulses as the modulated signal to the input of the at least one capacitive-coupled level shifter; and an SR latch having a set input electrically connected to a first output of the at least one capacitive-coupled level shifter and a reset input electrically connected to a second output of the at least one capacitive-coupled level shifter, the SR latch configured to output a level-shifted signal based on a state of the set input and the reset input.

12. The level shifter system of claim 11, wherein the level shifter system comprises a first capacitive-coupled level shifter and a second capacitive-coupled level shifter, wherein for each capacitive-coupled level shifter, no reference terminal is provided between the positive input terminal and the negative input terminal of the input, no common mode reference terminal is provided between the positive input terminal and the negative input terminal of the comparator circuit, and the modulated signal is differential between the positive input terminal of the input and the negative input terminal of the input, wherein the modulator is configured to apply the differential modulated signal to the first capacitive-coupled level shifter when the digital control signal is in a first state and apply the differential modulated signal to the second capacitive-coupled level shifter when the digital control signal is in a second state, wherein the first capacitive-coupled level shifter is configured to apply the shifted modulated signal to the set input of the SR latch when the digital control signal is in the first state, and wherein the second capacitive-coupled level shifter is configured to apply the shifted modulated signal to the reset input of the SR latch when the digital control signal is in the second state.

13. The level shifter system of claim 11, wherein the level shifter system comprises a single capacitive-coupled level shifter, wherein the single capacitive-coupled level shifter comprises a reference terminal between the positive input terminal and the negative input terminal of the input, and a common mode reference terminal between the positive input terminal and the negative input terminal of the comparator circuit, wherein the modulated signal is single-ended between the positive terminal and the reference terminal of the input, and between the negative input terminal and the reference terminal of the input, wherein the modulator is configured to apply the single-ended modulated signal between the positive input terminal and the negative input terminal of the input of the single capacitive-coupled level shifter when the digital control signal is in a first state, wherein the modulator is configured to apply the single-ended modulated signal between the negative input terminal and the negative input terminal of the input of the single capacitive-coupled level shifter when the digital control signal is in a second state, wherein the single capacitive-coupled level shifter is configured to apply the shifted modulated signal to the set input of the SR latch when the digital control signal is in the first state and to the reset input of the SR latch when the digital control signal is in the second state.

14. The level shifter system of claim 11, wherein the level shifter system is configured to apply the level-shifted signal to a high-side gate driver.

* * * * *